United States Patent
Li et al.

(10) Patent No.: US 7,589,964 B2
(45) Date of Patent: Sep. 15, 2009

(54) POWER SUPPLY APPARATUS

(75) Inventors: Ran Li, Amphur Muang (TH); Chanwit Prasantnakorn, Amphur Muang (TH); Chin-Huat Lim, Amphur Muang (TH)

(73) Assignee: Delta Electronics (Thailand) Public Co., Ltd., Amphur Maung (TH)

( * ) Notice: Subject to any disclaimer, the term of this patent is extended or adjusted under 35 U.S.C. 154(b) by 160 days.

(21) Appl. No.: 11/776,303

(22) Filed: Jul. 11, 2007

(65) Prior Publication Data

US 2008/0266792 A1    Oct. 30, 2008

(30) Foreign Application Priority Data

Apr. 27, 2007    (TW) .............................. 96115169 A

(51) Int. Cl.
*H05K 7/20* (2006.01)

(52) U.S. Cl. ...................... 361/694; 361/695; 361/719

(58) Field of Classification Search ........................ None
See application file for complete search history.

(56) References Cited

U.S. PATENT DOCUMENTS

| | | | | |
|---|---|---|---|---|
| 5,761,045 A | * | 6/1998 | Olson et al. ................. | 361/726 |
| 6,445,586 B1 | * | 9/2002 | Chou .......................... | 361/725 |
| 6,606,253 B2 | * | 8/2003 | Jackson et al. ............... | 361/796 |
| 7,142,423 B2 | * | 11/2006 | Lanni .......................... | 361/695 |
| 7,345,876 B2 | * | 3/2008 | Hong et al. .................. | 361/695 |
| 7,450,383 B1 | * | 11/2008 | Li et al. ....................... | 361/695 |
| 2002/0101752 A1 | * | 8/2002 | Harris et al. ................. | 363/144 |
| 2005/0099766 A1 | * | 5/2005 | Fraley et al. ................. | 361/685 |
| 2006/0104025 A1 | * | 5/2006 | Wabiszczewicz ........... | 361/694 |
| 2008/0266817 A1 | * | 10/2008 | Li ............................... | 361/747 |

* cited by examiner

*Primary Examiner*—Gregory D Thompson
(74) *Attorney, Agent, or Firm*—Kirton & McConkie; Evan R. Witt

(57) ABSTRACT

A power supply apparatus for use with a redundant power supply system includes a casing, a main circuit board and an airflow driving device. The casing includes a first airflow opening and a second airflow opening. The main circuit board is disposed within the casing and includes plural electronic components thereon. The airflow driving device is disposed in the middle region of the main circuit board. A cooling air is pumped by the airflow driving device to be introduced into the inner portion of the casing through one of the first airflow opening and the second airflow opening, then the heat generated from the electronic components is removed by the cooling air, and finally a heated air is exhausted through the other one of the first airflow opening and the second airflow opening.

20 Claims, 10 Drawing Sheets

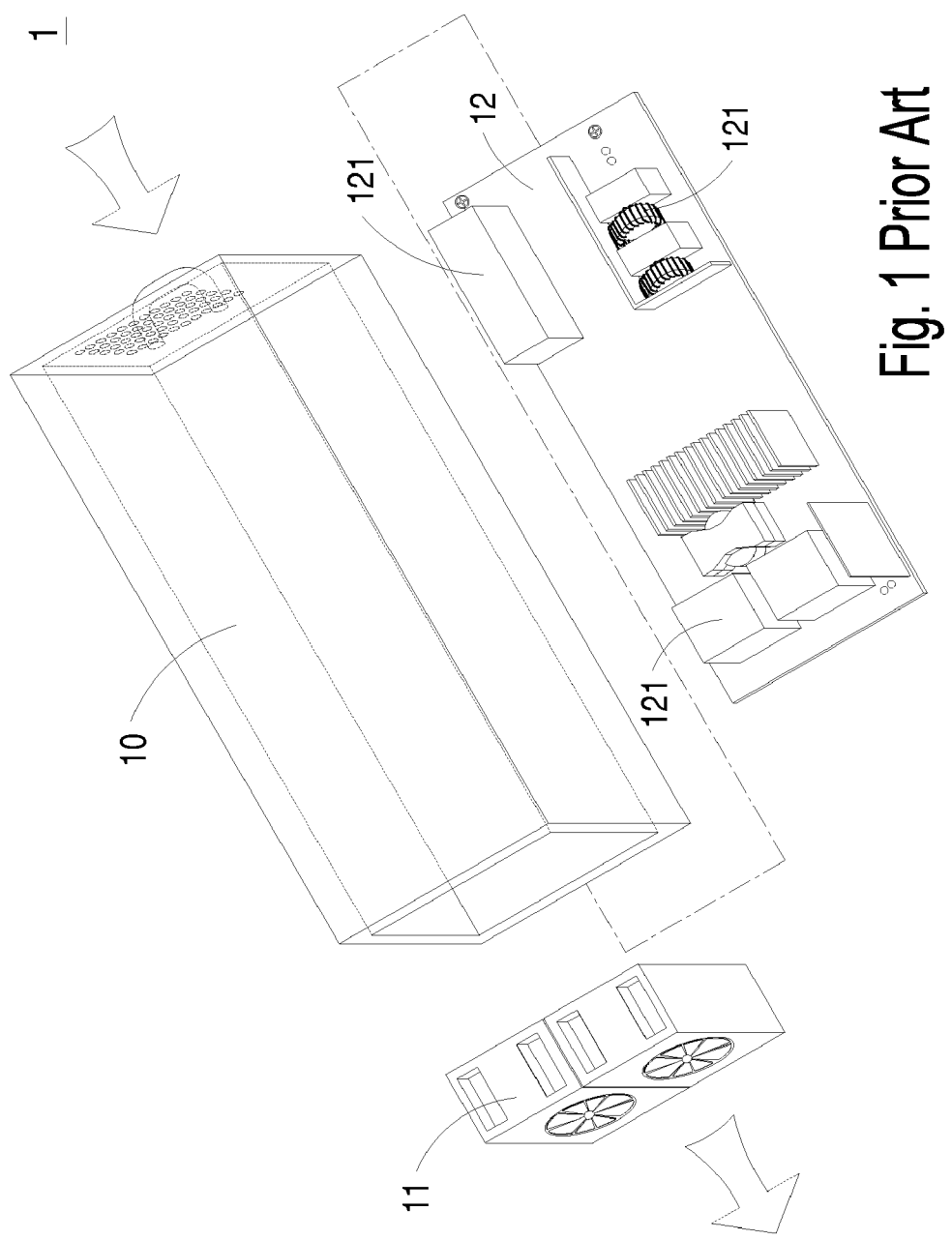

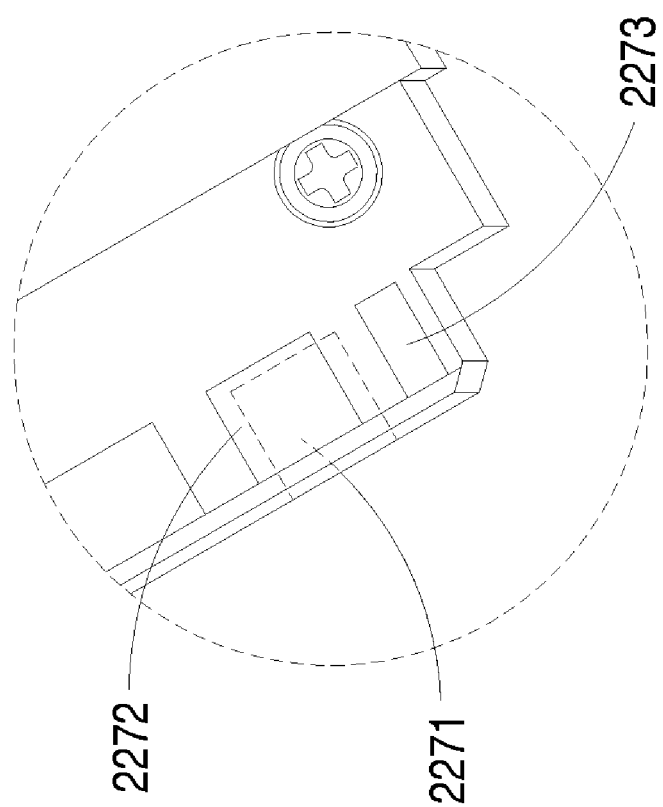

POWER SUPPLY APPARATUS

FIELD OF THE INVENTION

The present invention relates to a power supply apparatus, and more particularly to a power supply apparatus for use with a redundant power supply system.

BACKGROUND OF THE INVENTION

Power supply apparatuses are essential for many electronic appliances such as personal computers, industrial computers, servers, communication products or network products. Normally, the power supply apparatus may provide stable electricity to the electronic appliance. In a case that the power supply apparatus has a breakdown, the electronic appliance is possibly damaged or the data stored in the electronic appliance is lost. For enhancing capacity and reliability of power supply, a redundant power supply system has been proposed. The redundant power supply system includes a plurality of separated power supply apparatuses, which are electrically connected to each other and contained in a system cabinet. During operation of the redundant power supply system, individual power supply apparatuses share responsibility for providing electricity to the electronic appliance. If one of the power supply apparatuses has a breakdown and fails to normally provide electricity, the others could continuously provide electricity to the loads.

Referring to FIG. 1, a schematic exploded view of a conventional power supply apparatus for use with a redundant power supply system is illustrated. The power supply apparatus 1 includes a casing 10, a fan 11 and a circuit board 12. Several electronic components 121 are mounted on the circuit board 12. The fan 11 is embedded into an opening at a side of the casing 10 to remove heat generated from the electronic components contained in the casing 10. During operation of the fan 11, the ambient air is inhaled into the space within the casing 10 in the direction indicated as the arrow. The inhaled air is then conducted to the electronic components 121 of the circuit board 12 to partially remove the heat generated from the electronic components 121. At the same time, a hot airflow is exhausted to the surroundings through the fan 11. Since the hot airflow is exhausted through the fan 11, the temperature of the airflow in the vicinity of the fan 11 is relatively large. Due to the elevated temperature, the fan 11 has shortened life and impaired operating performance or even generates noise during operation.

Since the fan 11 is mounted on one side of the casing 10, the direction of the airflow is predetermined according to the manufacturer's design. For complying with the system cabinet of the redundant power supply system, the fan 11 should be located at either the front side or the rear side of the power supply apparatus 1. Therefore, the layout flexibility of the power supply apparatus 1 is insufficient.

In views of the above-described disadvantages resulted from the conventional method, the applicant keeps on carving unflaggingly to develop a power supply apparatus for use with a redundant power supply system according to the present invention through wholehearted experience and research

SUMMARY OF THE INVENTION

It is an object of the present invention to provide a power supply apparatus for use with a redundant power supply system, in which the airflow driving device is positioned on the middle region of the power supply apparatus to efficiently remove heat and provide stable electricity to the electronic appliance.

It is another object of the present invention to provide a power supply apparatus for use with a redundant power supply system, in which the temperature of the airflow in the vicinity of airflow driving device is reduced and thus the power supply apparatus has extended life and enhanced performance.

It is a further object of the present invention to provide a power supply apparatus for use with a redundant power supply system, in which the AC socket of the power supply apparatus can be positioned at the front side or rear side of the casing as required, thereby enhancing the layout flexibility.

In accordance with an aspect of the present invention, there is provided a power supply apparatus for use with a redundant power supply system. The power supply apparatus includes a casing, a main circuit board and an airflow driving device. The casing includes a first airflow opening and a second airflow opening. The main circuit board is disposed within the casing and includes plural electronic components thereon. The airflow driving device is disposed in the middle region of the main circuit board. A cooling air is pumped by the airflow driving device to be introduced into the inner portion of the casing through one of the first airflow opening and the second airflow opening, then the heat generated from the electronic components is removed by the cooling air, and finally a heated air is exhausted through the other one of the first airflow opening and the second airflow opening.

In accordance with another aspect of the present invention, there is provided a redundant power supply system. The redundant power supply system includes a system cabinet and at least two power supply apparatuses. The system cabinet at least includes a first receptacle and a second receptacle. The power supply apparatuses are swappable to be embedded into the first receptacle and the second receptacle. Each power supply apparatus includes a casing, a main circuit board and an airflow driving device. The casing includes a first airflow opening and a second airflow opening. The main circuit board is disposed within the casing and includes plural electronic components thereon. The airflow driving device is disposed in the middle region of the main circuit board. A cooling air is pumped by the airflow driving device to be introduced into the inner portion of the casing through one of the first airflow opening and the second airflow opening, then the heat generated from the electronic components is removed by the cooling air, and finally a heated air is exhausted through the other one of the first airflow opening and the second airflow opening.

The above contents of the present invention will become more readily apparent to those ordinarily skilled in the art after reviewing the following detailed description and accompanying drawings, in which:

BRIEF DESCRIPTION OF THE DRAWINGS

FIG. 1 is a schematic exploded view of a conventional power supply apparatus for use with a redundant power supply system;

FIG. 3(c) is a schematic partial enlarged view of the section A shown in FIG. 3(a);

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
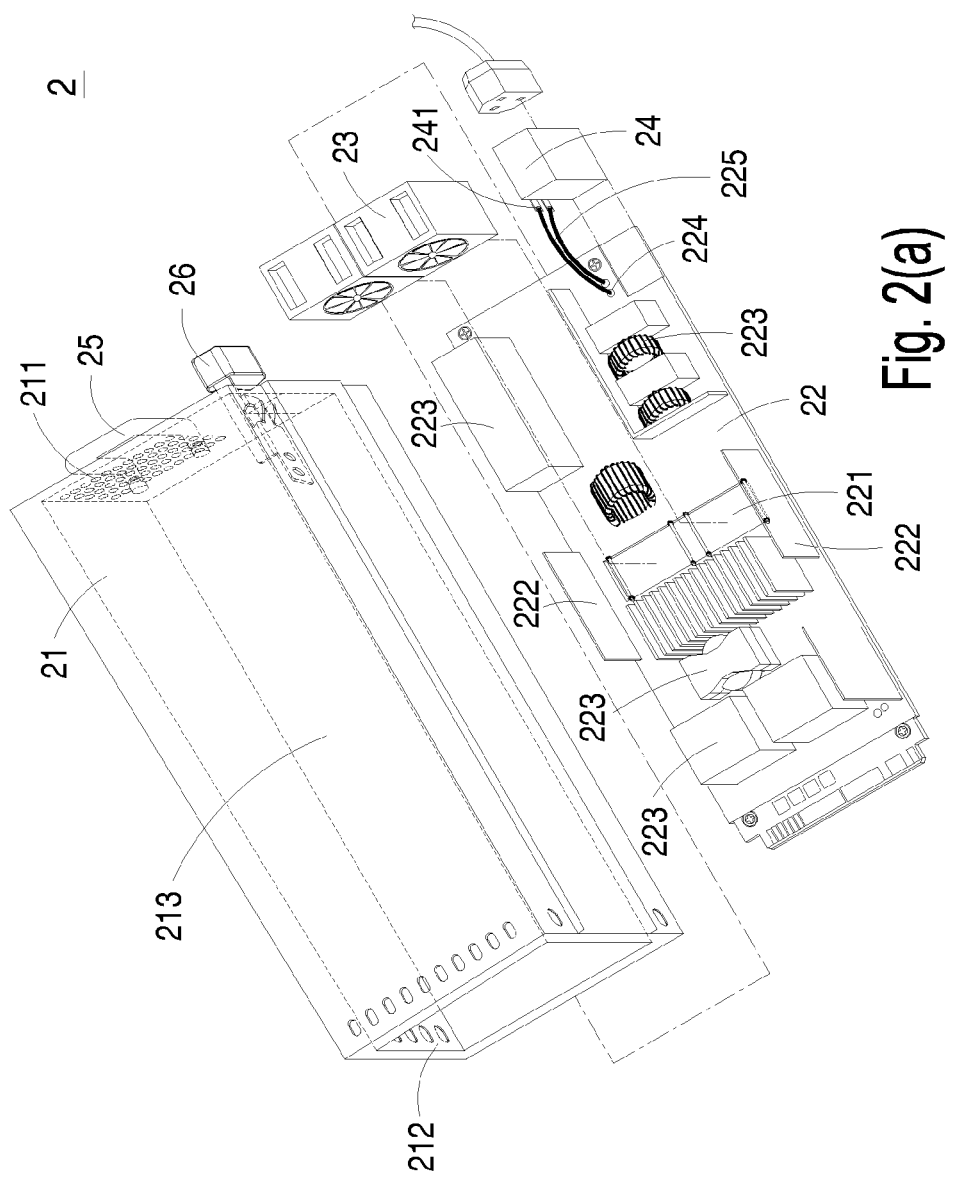
FIG. 2(a) is a schematic exploded view of a power supply apparatus according to a first preferred embodiment of the present invention.
Figure 2B:
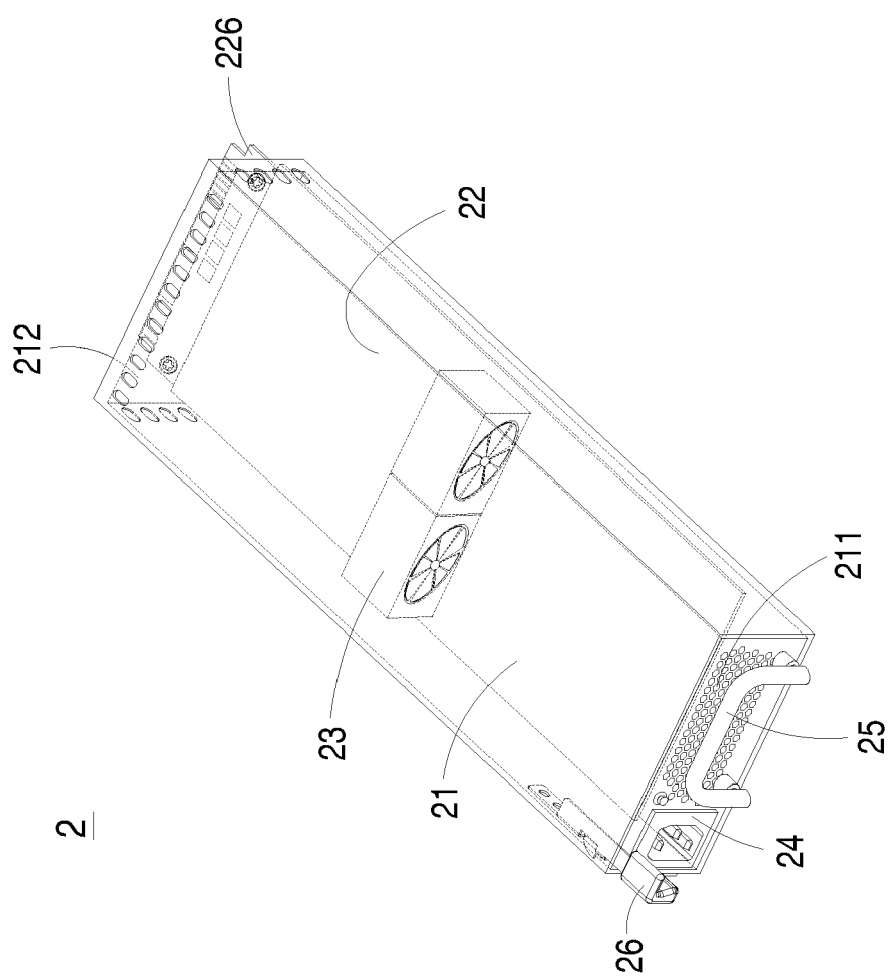
FIG. 2(b) is a schematic assembled view of the power supply apparatus of FIG. 2(a)

FIGS. 2(a) and 2(b) are respectively schematic exploded and assembled views of a power supply apparatus according to a first preferred embodiment of the present invention. The power supply apparatus 2 may be included in a redundant power supply system to provide stable electricity to an electronic appliance. The power supply apparatus 2 principally includes a casing 21, a main circuit board 22 and an airflow driving device 23. The casing 21 includes a first airflow opening 211 and a second airflow opening 212. The first airflow opening 211 and the second airflow opening 212 are disposed on opposite sides of the casing 21. An airflow channel 213 is defined between the first airflow opening 211 and the second airflow opening 212. In this embodiment, the first airflow opening 211 includes plural ventilation holes. The second airflow opening 212 includes one or more ventilation holes. The main circuit board 22 is disposed within the casing 21. Several electronic components 223 are mounted on the main circuit board 22 to provide power conversion. Especially, a perforation 221 is disposed in the middle region of the main circuit board 22 for receiving the airflow driving device 23 therein, so that the airflow driving device 23 is positioned on the middle region of the main circuit board 22. The airflow driving device 23 includes at least a fan.

In an embodiment, when the airflow driving device 23 is actuated, a greater amount of cooling air is introduced into the airflow channel 213 through the first airflow opening 211, the cooling air is then conducted to the electronic components 223 to remove a portion of heat from the electronic components 223, and finally a heated air is exhausted through the second airflow opening 212. Nevertheless, the directions of the cooling air and the heated air may be reversed. That is, when the airflow driving device 23 is actuated, a greater amount of cooling air is introduced into the airflow channel 213 through the second airflow opening 212, the cooling air is then conducted to the electronic components 223 to remove a portion of heat from the electronic components 223, and finally a heated air is exhausted through the first airflow opening 211. Consequently, the power supply apparatus 2 will be normally operated. As previously described, the fan 11 of the power supply apparatus 1 of FIG. 1 is disposed at one side of the casing 10, and thus the temperature at the downstream of the airflow is elevated. In contrast, since the airflow driving device 23 is neither disposed at the first airflow opening 211 or the second airflow opening 212, the power supply apparatus 2 of the present invention has extended life and enhanced performance. In addition, since the airflow driving device 23 is not in direct contact with the surroundings, the sound heard by the user is declined.

Please refer to FIG. 2(a) again. One or more auxiliary circuit boards 222 are mounted on the main circuit board 22 at the bilateral sides of the perforation 221. The auxiliary circuit boards 222 have trace patterns electrically connected to the main circuit board 22 so as to cooperatively form the power converting circuit. Moreover, the auxiliary circuit boards 222 may facilitate reinforcing the main circuit board 22 to withstanding vibration or impact.

Figure 3A:
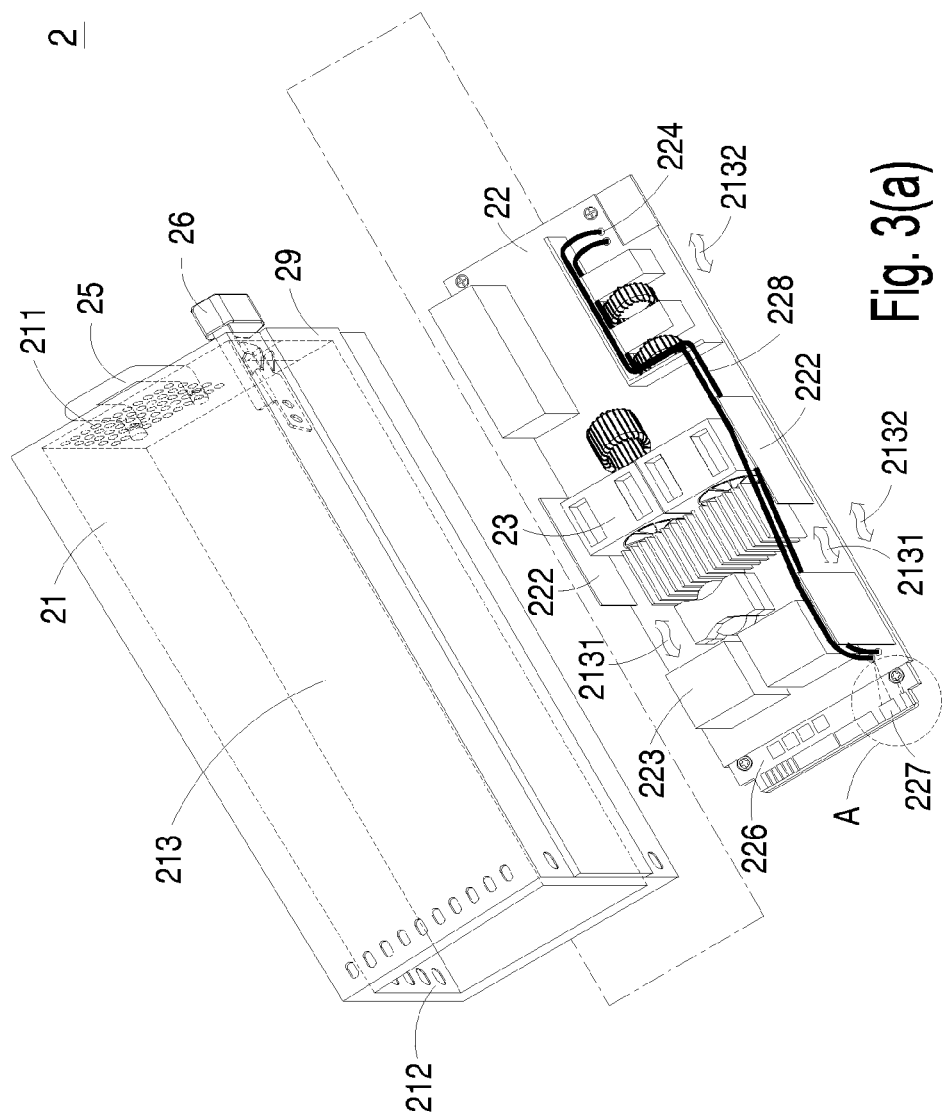
FIG. 3(a) is a schematic exploded view of a power supply apparatus according to a second preferred embodiment of the present invention.
Figure 3B:
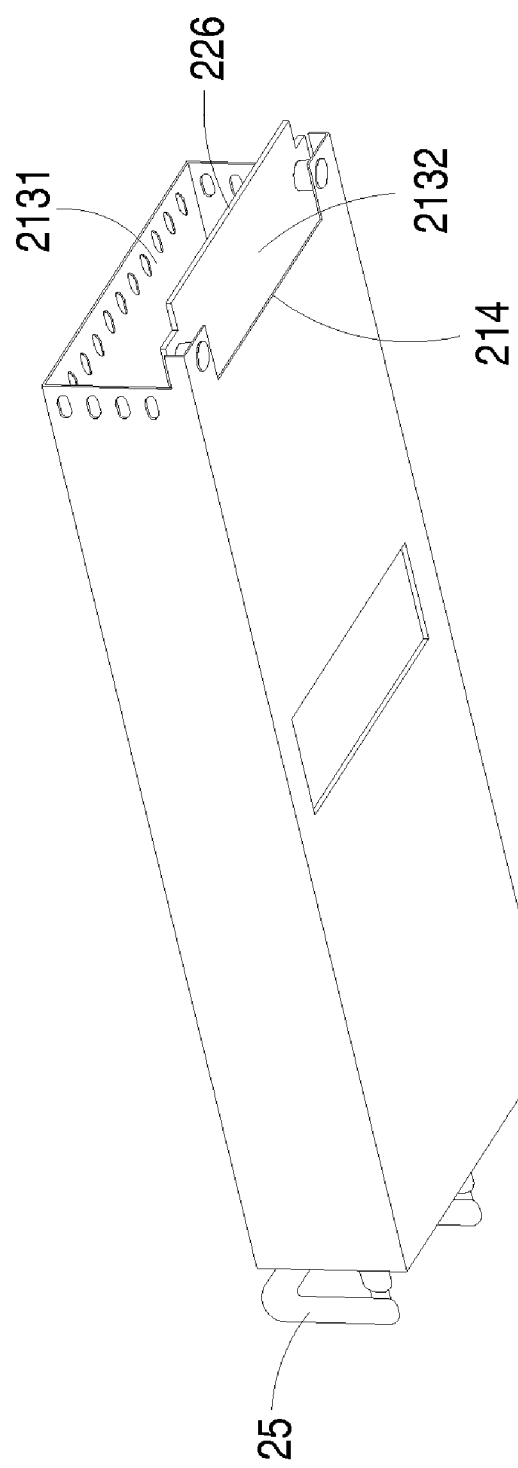
FIG. 3(b) is a schematic assembled view of the power supply apparatus of FIG. 3(a)

FIGS. 3(a) and 3(b) are respectively schematic exploded and assembled views of a power supply apparatus according to a second preferred embodiment of the present invention. In this embodiment, the casing 21, the main circuit board 22, the first airflow opening 211, the second airflow opening 212 and the auxiliary circuit boards 222 included therein are identical to those shown in FIG. 2, and are not redundantly described herein. Especially, the airflow driving device 23 is partially penetrated through the perforation 221 such that the airflow driving device 23 is positioned in the middle region of the main circuit board 22. In such manner, a first airflow channel 2131 is cooperatively defined by the upper inner wall of the casing 21 and the upper surface of the main circuit board 22, and a second airflow channel 2132 is cooperatively defined by the lower inner wall of the casing 21 and the lower surface of the main circuit board 22. The first airflow channel 2131 and the second airflow channel 2132 are both communicated with the first airflow opening 211 and the second airflow opening 212. When the airflow driving device 23 is actuated, by using one of the first airflow opening 211 and the second airflow opening 212 as an entrance and the other one as an exit, a greater amount of cooling air is introduced into the first airflow channel 2131 and the second airflow channel 2132 to remove a portion of heat from the electronic components 223 and finally a heated air is exhausted.

Figure 4:
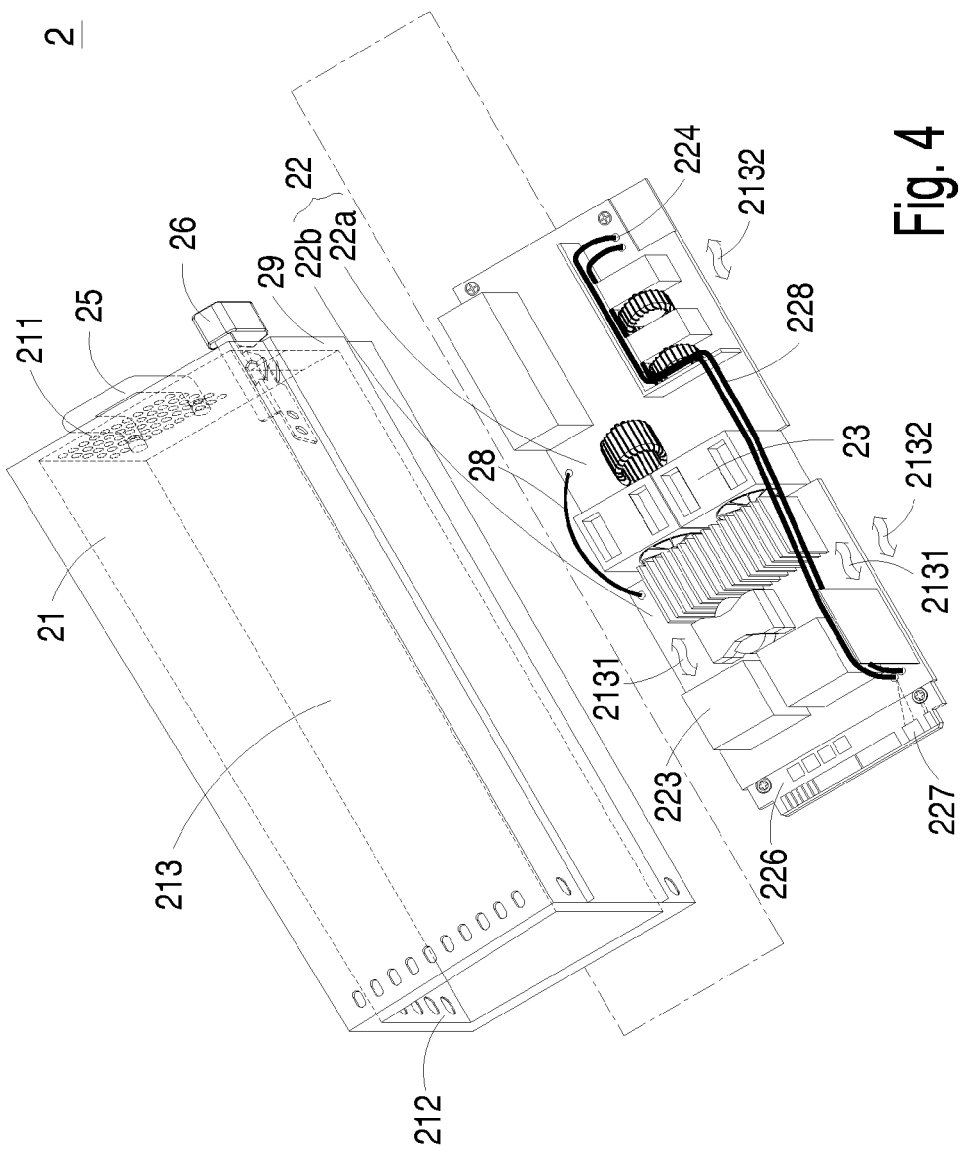
FIG. 4 is a schematic exploded view of a power supply apparatus according to a third preferred embodiment of the present invention.

Referring to FIG. 4, a schematic exploded view of a power supply apparatus according to a third preferred embodiment of the present invention is illustrated. The main circuit board 22 includes a first daughter circuit board 22a and a second daughter circuit board 22b. The first daughter circuit board 22a and the second daughter circuit board 22b are separated from each other but are electrically connected to each other via a connecting wire 28. The airflow driving device 23 is arranged between the first daughter circuit board 22a and the second daughter circuit board 22b. In this embodiment, the length of the first daughter circuit board 22a is equal to that of the second daughter circuit board 22b such that the airflow driving device 23 is substantially located in the middle portion of the main circuit board 22. Likewise, as is described in FIG. 3(b), a first airflow channel 2131 is cooperatively defined by the upper inner wall of the casing 21 and the upper surface of the main circuit board 22, and a second airflow channel 2132 is cooperatively defined by the lower inner wall of the casing 21 and the lower surface of the main circuit board 22. The first airflow channel 2131 and the second airflow channel 2132 are both communicated with the first airflow opening 211 and the second airflow opening 212.

Please refer to FIGS. 2(a), 2(b), 3(a) to 3(b) again. The airflow driving device 23 is neither disposed at the first airflow opening 211 or the second airflow opening 212, but is substantially located in the middle portion of the main circuit board 22. As a consequence, the AC socket 24 of the power supply apparatus 2 can be positioned at the front side or rear side of the casing 21 as required, thereby enhancing the layout flexibility. As shown in FIG. 2(a), the AC socket 24 is disposed at an edge of the main circuit board 22, and the pins 241 of the AC socket 24 are electrically connected to the contact portions 224 of the main circuit board 22 via a conducting wire 225. Alternatively, the pins 241 of the AC socket 24 may be directly welded on the contact portions 224 of the main circuit board 22. As shown in FIG. 3(a), in replace of the AC socket 24, another edge of the main circuit board 22 further include a connection interface such as an edge connector 226. The edge connector 226 has a specified trace portion 227 to receive external AC input voltage. In addition, the trace portion 227 is electrically connected to the contact portions 224 of the main circuit board 22 via a conducting wire 228. The AC input voltage is converted by the power converting circuit of the main circuit board 22 and the converted voltage is outputted through other trace portions of the edge connector 226. FIG. 3(c) is a schematic partial enlarged view of the section A shown in FIG. 3(a). In some embodiments, the trace portion 227 of the edge connector 226 includes a naught wire 2271 and a live wire 2272, which are disposed on opposite surfaces of the trace portion 227, and also an earth wire 2273. Consequently, the trace density of the edge connector 226 is increased and the space utilization of the edge connector 226 is enhanced. In some embodiments, the edge connector 226 of the main circuit board 22 is penetrated through the second airflow opening 212 of the casing 21.

Please refer to FIGS. 2(a), 2(b), 3(a) to 3(b) again. The power supply apparatus 2 further includes a handle 25 and a fastening element 26. In response to a pulling force exerted on the handle 25, the power supply apparatus 2 may be withdrawn from the system cabinet (not shown) of the redundant power supply system. Moreover, after the power supply apparatus 2 is placed into the system cabinet of the redundant power supply system, the power supply apparatus 2 is fixed in the system cabinet via the fastening element 26 so as to avoid accidentally swapping the power supply apparatus 2. As shown in FIG. 3(b), the casing 21 of the power supply apparatus 2 further includes a notch 214 under the edge connector 226 for facilitating heat dissipation.

Figure 5:
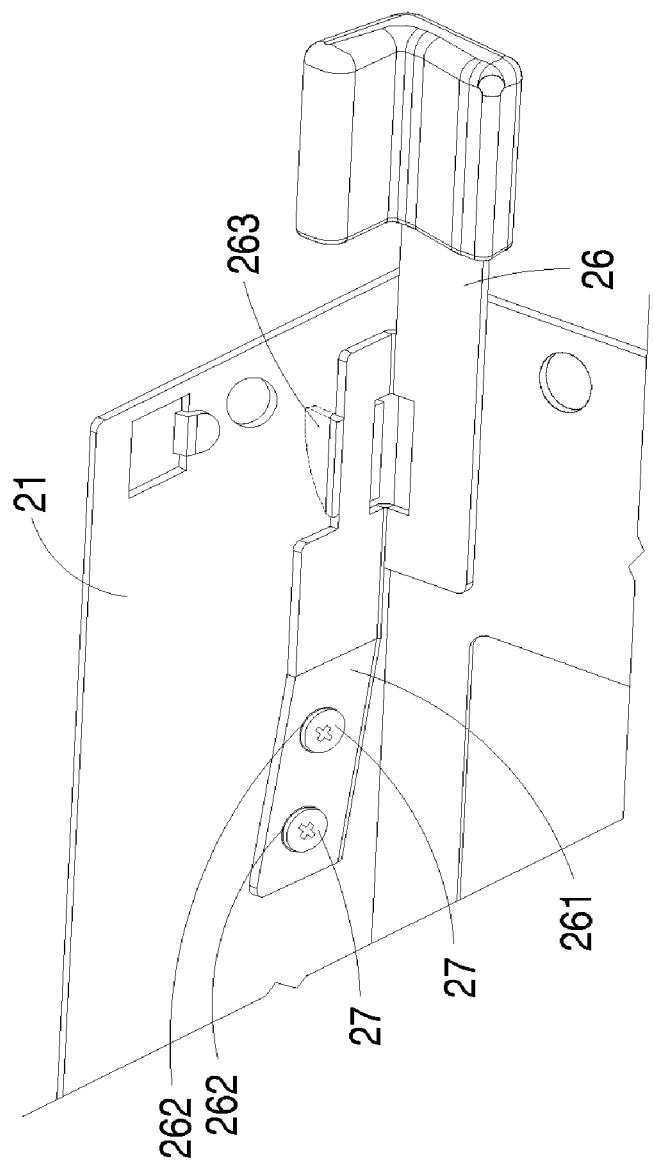
FIG. 5 is a schematic perspective view of an exemplary fastening element of the power supply apparatus.
Figure 6:
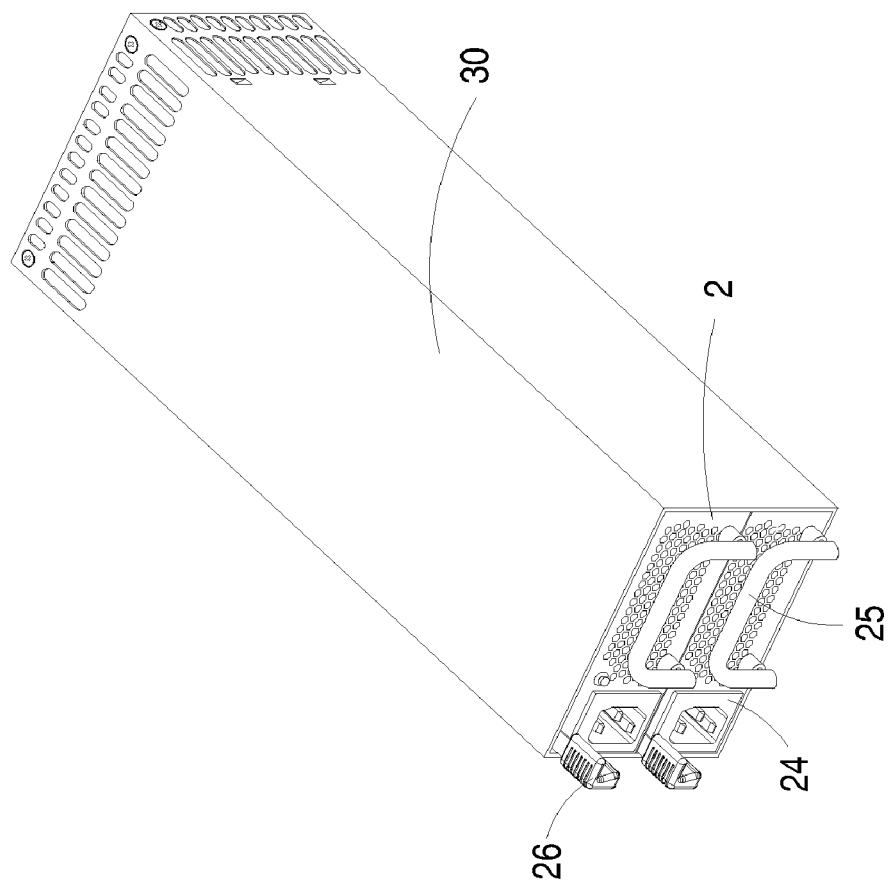
FIG. 6 is a schematic perspective view illustrating connection between the power supply apparatus and the system cabinet of a redundant power supply system by using the fastening element.

FIG. 5 is a schematic perspective view of an exemplary fastening element 26 of the power supply apparatus 2. The fastening element 26 includes a bent part 261 and at least an opening 262. FIG. 6 is a schematic perspective view illustrating connection between the power supply apparatus 2 and the system cabinet 30 of a redundant power supply system 3 by using the fastening element 26. Please refer to FIGS. 5 and 6. By penetrating a connecting element 27 such as a screw or a rivet through the opening 262, the fastening element 26 is attached onto an inner surface of the casing 21. Moreover, the fastening element 26 further includes a protrusion part 263 penetrating through the casing 21 and corresponding to a recess structure (not shown) of the system cabinet 30 of the redundant power supply system 3. When the power supply apparatus 2 is placed into the receptacle of the system cabinet 30, the protrusion part 263 of the fastening element 26 is embedded into the recess structure of the system cabinet 30 such that the power supply apparatus 2 is firmly fixed in the system cabinet 30. For a purpose of withdrawing the power supply apparatus 2, an external force is exerted on the free end of the fastening element 26 to disengage the protrusion part 263 of the fastening element 26 from the recess structure of the system cabinet 30 and then the power supply apparatus 2 is pulled out of the system cabinet 30. By the way, the fastening element 26 has sufficient elasticity due to the bent part 261.

In the embodiments as shown in FIGS. 5 and 6, the fastening element 26 is disposed beside the AC socket 24. In a case that an external plug (not shown) is plugged into the AC socket 24, the main body of the plug will be sustained against the fastening element 26, so that the external force exerted on the free end of the fastening element 26 fails to disengage the protrusion part 263 from the recess structure. At this moment, an external AC voltage will be transmitted to the AC socket 24 through an external power cable (not shown) and the plug. That is, once the external plug is plugged into the AC socket 24, the power supply apparatus 2 fails to be pulled out of the system cabinet 30.

Figure 7:
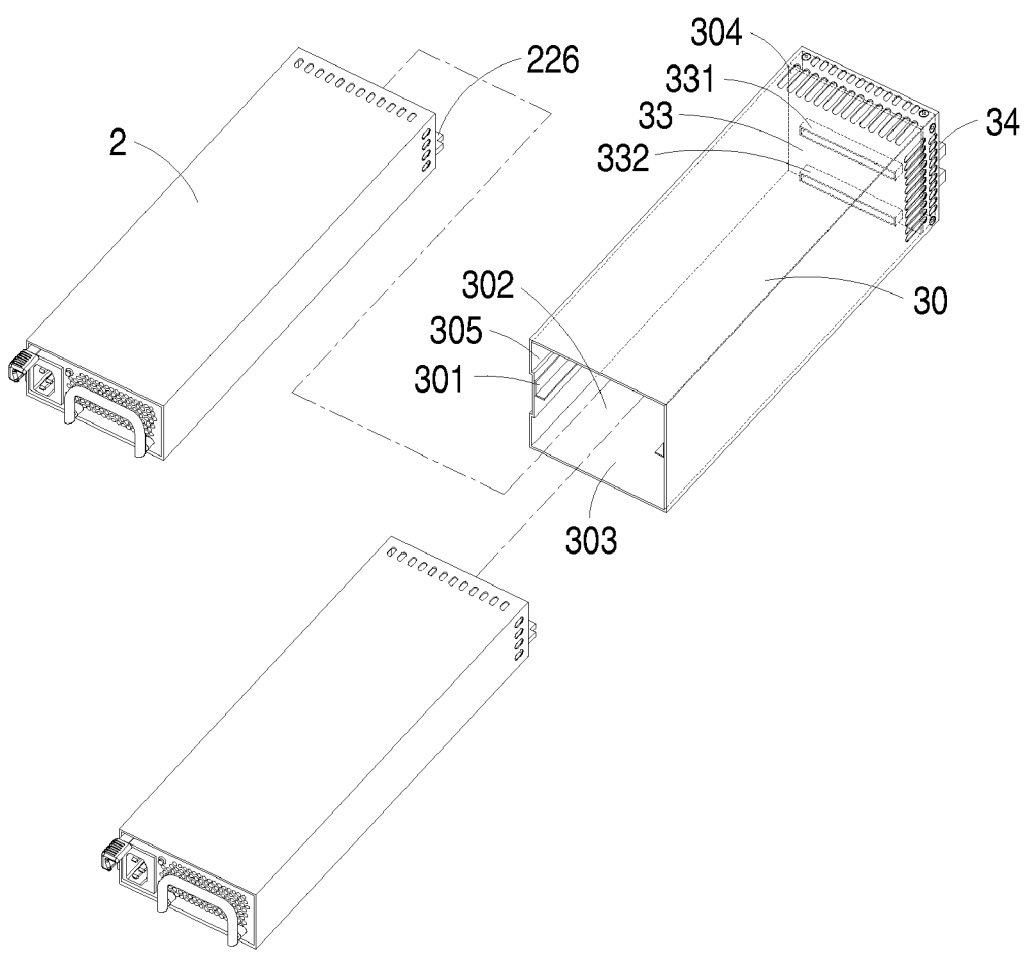
FIG. 7 is a schematic exploded view of the redundant power supply system.

FIG. 7 is a schematic exploded view of the redundant power supply system. The redundant power supply principally includes a system cabinet 30 and at least two power supply apparatuses 2. The system cabinet 30 includes a first receptacle 302 and a second receptacle 303, which are separated by a partition plate 301. These two power supply apparatuses 2 may be accommodated within the first receptacle 302 and the second receptacle 303, respectively. In some embodiments, these two power supply apparatuses 2 are swappable to be embedded into the first receptacle 302 and the second receptacle 303, respectively. The redundant power supply 3 further includes a power converting circuit board 33 inside the system cabinet 30. For example, the power converting circuit board 33 includes a DC/DC converting circuit. In this embodiment, the power converting circuit board 33 is disposed on the inner surface of the rear side of the system cabinet 30 and substantially perpendicular to the length of the system cabinet 30. Moreover, the power converting circuit board 33 includes a first insertion slot 331 and a second insertion slot 332. The edge connectors 226 of the power supply apparatuses 2 are inserted into the first insertion slot 331 and the second insertion slot 332 so as to be electrically connected to the power converting circuit board 33. The system cabinet 30 further includes plural ventilation holes 304 in the vicinity of the power converting circuit board 33. The airflow inhaled by the airflow driving device 23 may also remove a portion of heat from the power converting circuit board 33, and the heated air is exhausted through the ventilation holes 304 in order to enhance the heat-dissipating efficiency.

Please refer to FIG. 3(a) and FIG. 7 again. The power supply apparatus 2 has at least a protrusion block 29 on a side thereof. The inner wall of the system cabinet 30 further includes a track 305 corresponding to the protrusion block 29. When the power supply apparatus 2 is embedded into the system cabinet 30, the protrusion block 29 of the power supply apparatus 2 is glided along the track 305 so as to avoid erroneous connection between the power supply apparatus 2 and corresponding insertion slot.

In the above embodiments, a cooling air is pumped by the airflow driving device to be introduced into the inner portion of the casing through one of the first airflow opening and the second airflow opening, then the heat generated from the electronic components is removed by the cooling air, and finally a heated air is exhausted through the other one of the first airflow opening and the second airflow opening. Moreover, the AC socket of the power supply apparatus can be positioned at the front side or rear side of the casing as required, thereby enhancing the layout flexibility.

In the above embodiments, since the airflow driving device is positioned on the middle region of the main circuit board of the power supply apparatus, the temperature of the airflow in the vicinity of airflow driving device is reduced when compared with the prior art. As a consequence, the heat generated from the electronic components of the power supply apparatus will be efficiently removed and the power supply apparatus may provide stable electricity to the electronic appliance. On the other hand, since the temperature of the airflow in the vicinity of airflow driving device is reduced, the power supply apparatus has extended life and enhanced performance. In addition, since the airflow driving device is not in direct contact with the surroundings, the sound heard by the user is declined.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power supply apparatus for use with a redundant power supply system, said power supply apparatus comprising:
   a casing including a first airflow opening and a second airflow opening;
   a main circuit board disposed within said casing and including plural electronic components thereon; and
   an airflow driving device disposed in the middle region of said main circuit board and having an axis parallel to said main circuit board, wherein a cooling air is pumped by said airflow driving device to be introduced into the inner portion of said casing through one of said first airflow opening and said second airflow opening, then the heat generated from said electronic components is removed by said cooling air, and finally a heated air is exhausted through the other one of said first airflow opening and said second airflow opening.

2. The power supply apparatus according to claim 1 wherein said first airflow opening and said second airflow opening are disposed on opposite sides of said casing.

3. The power supply apparatus according to claim 1 wherein said first airflow opening includes plural ventilation holes, and said second airflow opening includes one ventilation hole.

4. The power supply apparatus according to claim 1 wherein said main circuit board further includes a perforation in the middle region of said main circuit board so as to receive said airflow driving device therein.

5. The power supply apparatus according to claim 4 wherein said airflow driving device is partially penetrated through said perforation and fixed in said perforation.

6. The power supply apparatus according to claim 5 wherein a first airflow channel is cooperatively defined by an upper inner wall of said casing and an upper surface of said main circuit board, and a second airflow channel is cooperatively defined by a lower inner wall of said casing and a lower surface of said main circuit board.

7. The power supply apparatus according to claim 4 wherein at least an auxiliary circuit board is mounted on said main circuit board and beside said perforation and has trace patterns electrically connected to said electronic components of said main circuit board, thereby cooperatively forming a power converting circuit and facilitating reinforcing the main circuit board.

8. The power supply apparatus according to claim 1 further including an AC socket at an edge of said main circuit board.

9. The power supply apparatus according to claim 1 further including a fastening element, wherein said fastening element includes:
   a first end fixed on an inner surface of said casing;
   a free end opposite to said first end;
   a bent part; and
   a protrusion part engaged with a recess structure of a system cabinet of said redundant power supply system to fix said power supply apparatus in said system cabinet.

10. The power supply apparatus according to claim 1 wherein said casing further includes a handle.

11. The power supply apparatus according to claim 1 wherein said airflow driving device is a fan.

12. The power supply apparatus according to claim 1 wherein said main circuit board further includes an edge connector.

13. The power supply apparatus according to claim 12 wherein said edge connector includes a specified trace portion for receiving an external AC input voltage therevia, and said specified trace portion of said edge connector includes a naught wire and a live wire on opposite surfaces of said trace portion.

14. The power supply apparatus according to claim 1 wherein said casing further includes a notch at a bottom edge thereof.

15. The power supply apparatus according to claim 1 wherein said main circuit board includes a first daughter circuit board and a second daughter circuit board, which are separated from each other but electrically connected to each other via a connecting wire.

16. The power supply apparatus according to claim 15 wherein said airflow driving device is arranged between said first daughter circuit board and said second daughter circuit board such that said airflow driving device is substantially located in the middle region of said main circuit board.

17. A redundant power supply system comprising:
   a system cabinet at least including a first receptacle and a second receptacle;
   at least two power supply apparatuses swappable to be embedded into said first receptacle and said second receptacle, respectively, each power supply apparatus including:
   a casing including a first airflow opening and a second airflow opening;
   a main circuit board disposed within said casing and including plural electronic components thereon; and
   an airflow driving device disposed in the middle region of said main circuit board and having an axis parallel to said main circuit board, wherein a cooling air is pumped by said airflow driving device to be introduced into the inner portion of said casing through one of said first airflow opening and said second airflow opening, then the heat generated from said electronic components is removed by said cooling air, and finally a heated air is exhausted through the other one of said first airflow opening and said second airflow opening.

18. The redundant power supply system according to claim 17 wherein said first receptacle and said second receptacle are separated by a partition plate.

19. The redundant power supply system according to claim 17 wherein said system cabinet further includes a power converting circuit board having a first insertion slot and a second insertion slot to be coupled with corresponding connection interfaces of said power supply apparatuses.

20. The redundant power supply system according to claim 19 wherein said system cabinet further includes plural ventilation holes in the vicinity of said power converting circuit board.

* * * * *